United States Patent
Mimura et al.

(10) Patent No.: US 7,315,728 B2
(45) Date of Patent: Jan. 1, 2008

(54) POLARIZED WAVE MEASURING APPARATUS, AND ANTENNA CHARACTERISTIC MEASURING APPARATUS AND RADIO WAVE MEASURING APPARATUS USING THE SAME

(75) Inventors: Masahiro Mimura, Tokyo (JP); Yoichi Nakagawa, Tokyo (JP); Kentaro Miyano, Yokohama (JP); Yoshio Koyanagi, Ebina (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 1022 days.

(21) Appl. No.: 10/473,592

(22) PCT Filed: Feb. 27, 2003

(86) PCT No.: PCT/JP03/02186

§ 371 (c)(1),
(2), (4) Date: Oct. 10, 2003

(87) PCT Pub. No.: WO03/073657

PCT Pub. Date: Sep. 4, 2003

(65) Prior Publication Data
US 2004/0104843 A1    Jun. 3, 2004

(30) Foreign Application Priority Data
Feb. 27, 2002    (JP)    ............................ 2002-050977
Feb. 26, 2003    (JP)    ............................ 2003-049918

(51) Int. Cl.
*H04B 17/00*    (2006.01)

(52) U.S. Cl. ................... 455/67.16; 455/67.11; 343/756

(58) Field of Classification Search ............ 455/67.16, 455/67.13, 67.11, 63.1; 343/756, 757
See application file for complete search history.

(56) References Cited

U.S. PATENT DOCUMENTS 4,107,678 A * 8/1978 Powell .................... 342/62
4,313,220 A * 1/1982 Lo et al. .................. 455/304

(Continued)

FOREIGN PATENT DOCUMENTS

DE    4327231    2/1996
FR    2750209    12/1997

(Continued)

OTHER PUBLICATIONS

English Language Abstract of DE 43 27 231, Feb. 1995.

(Continued)

*Primary Examiner*—Lewis West
(74) *Attorney, Agent, or Firm*—Greenblum & Bernstein, P.L.C.

(57) ABSTRACT

A phase shift section phase-shifts the second band-restricted signal to a first phase-shifted signal and a second phase-shifted signal having a phase that is different from the phase of the first phase-shifted signal by 90 degrees. A first signal mixing section mixes the first band-restricted signal and the first phase-shifted signal. A second signal mixing section mixes the second band-restricted signal and the second phase-shifted signal. A phase difference calculation section calculates the phase difference value from the first mixed signal and the second mixed signal stripped of frequencies other than a desired baseband frequency. A polarization calculation section calculates reception polarization from the first reception field intensity value, second reception field intensity value and phase difference value.

9 Claims, 6 Drawing Sheets

U.S. PATENT DOCUMENTS

| | | | | |
|---|---|---|---|---|
| 4,323,899 A | * | 4/1982 | Barnes et al. | 342/90 |
| 5,185,608 A | * | 2/1993 | Pozgay | 342/17 |
| 5,420,590 A | | 5/1995 | Shea | |
| 5,568,158 A | * | 10/1996 | Gould | 343/756 |
| 5,712,641 A | * | 1/1998 | Casabona et al. | 342/362 |
| 5,844,950 A | * | 12/1998 | Aono et al. | 375/346 |
| 5,943,372 A | * | 8/1999 | Gans et al. | 375/347 |
| 5,959,592 A | * | 9/1999 | Petruzzelli | 725/68 |
| 6,442,371 B1 | * | 8/2002 | Lyu | 455/67.11 |
| 7,130,577 B2 | * | 10/2006 | Nakamura | 455/3.02 |
| 2002/0102951 A1 | * | 8/2002 | Nakano et al. | 455/118 |
| 2003/0027586 A1 | * | 2/2003 | Johnson et al. | 455/517 |

OTHER PUBLICATIONS

English Language Abstract of FR 2 750 209, Dec. 1997.
"IEEE Standard Test Procedures For Antennas", published Dec. 19, 1979, ANSI/IEEE Std. 149-1979.
"Polarization Measurement: Part 2" Watkins-Johnson Company, Tech-Notes, vol. 15, No. 1, published Jan. 1988, reference XP002443772.

* cited by examiner

POLARIZED WAVE MEASURING APPARATUS, AND ANTENNA CHARACTERISTIC MEASURING APPARATUS AND RADIO WAVE MEASURING APPARATUS USING THE SAME

TECHNICAL FIELD

The present invention relates to a polarized wave measuring apparatus, and antenna characteristic apparatus and radio wave measuring apparatus using the polarized wave measuring apparatus, and mainly, to a measuring apparatus applied to evaluation of antennas used for radio communication equipment.

BACKGROUND ART

A radio wave is generally defined by field intensity and polarization. However, a radio wave actually received by an antenna is generally evaluated only by field intensity. Thus, polarization is only considered in special cases such as a communication using an antenna taking advantage of a circular polarization characteristic.

The reason that an evaluation of polarization is not considered is that propagation of radio waves between the transmitting and receiving sides in a communication over a relatively wide range like broadcasting is very complicated due to reflections, shielding or scattering caused by structures, and therefore it is considered more effective to adopt a stochastic approach assuming that received polarized waves are random.

In this case, when an antenna characteristic used for equipment or a propagation characteristic of radio waves emitted from an antenna is measured, it is only an evaluation based on emission power or field intensity that is required. For example, directive gain of an antenna is generally measured based on electric power and a polarization characteristic is not considered except special cases.

For measurement of field intensity of an incoming signal when a communication service area is decided, an evaluation is also generally based on only electric power for similar reasons.

However, as the application range of radio communication expands, there is a tendency to reduce one radio communication area to improve the utilization rate of radio waves or to increase the amount of information transmitted. When the distance between the transmitting side and receiving side is shortened, radio waves are also propagated under simple conditions, and therefore the precondition that the polarization characteristic is random can no longer be held. For this reason, for measurement of such a radio wave environment, not only electric power but also the polarization characteristic needs to be taken into consideration.

Furthermore, the same applies to an evaluation of antenna characteristics. Especially when an antenna is used in close contact with the human body as in the case of a cellular phone, even if the antenna is the one that emits linear polarization as in the case of a monopole antenna, when the antenna is actually used the effect of the human body close to the antenna on the polarization characteristic is also so great that the polarization characteristic of the antenna may not be linear polarization, either.

However, since a conventional apparatus needs to detect phase information of radio waves at a carrier signal frequency to measure the polarization characteristic of radio waves, the problem is that it requires a very complicated structure.

DISCLOSURE OF INVENTION

It is a first object of the present invention to provide a polarized wave measuring apparatus, and an antenna characteristic apparatus and radio wave measuring apparatus using the polarized wave measuring apparatus capable of measuring not only field intensity but also polarization of radio waves.

It is a second object of the present invention to provide a polarized wave measuring apparatus, and an antenna characteristic apparatus and radio wave measuring apparatus using the polarized wave measuring apparatus capable of measuring a polarization characteristic in a temporally continuous manner.

It is a third object of the present invention to provide a polarized wave measuring apparatus, and an antenna characteristic apparatus and radio wave measuring apparatus using the polarized wave measuring apparatus capable of evaluating a polarization characteristic of incoming radio waves.

It is a fourth object of the present invention to provide a polarized wave measuring apparatus, and an antenna characteristic apparatus and radio wave measuring apparatus using the polarized wave measuring apparatus capable of evaluating a polarization characteristic using polarized wave measuring means.

BEST MODE FOR CARRYING OUT THE INVENTION

Figure 1:
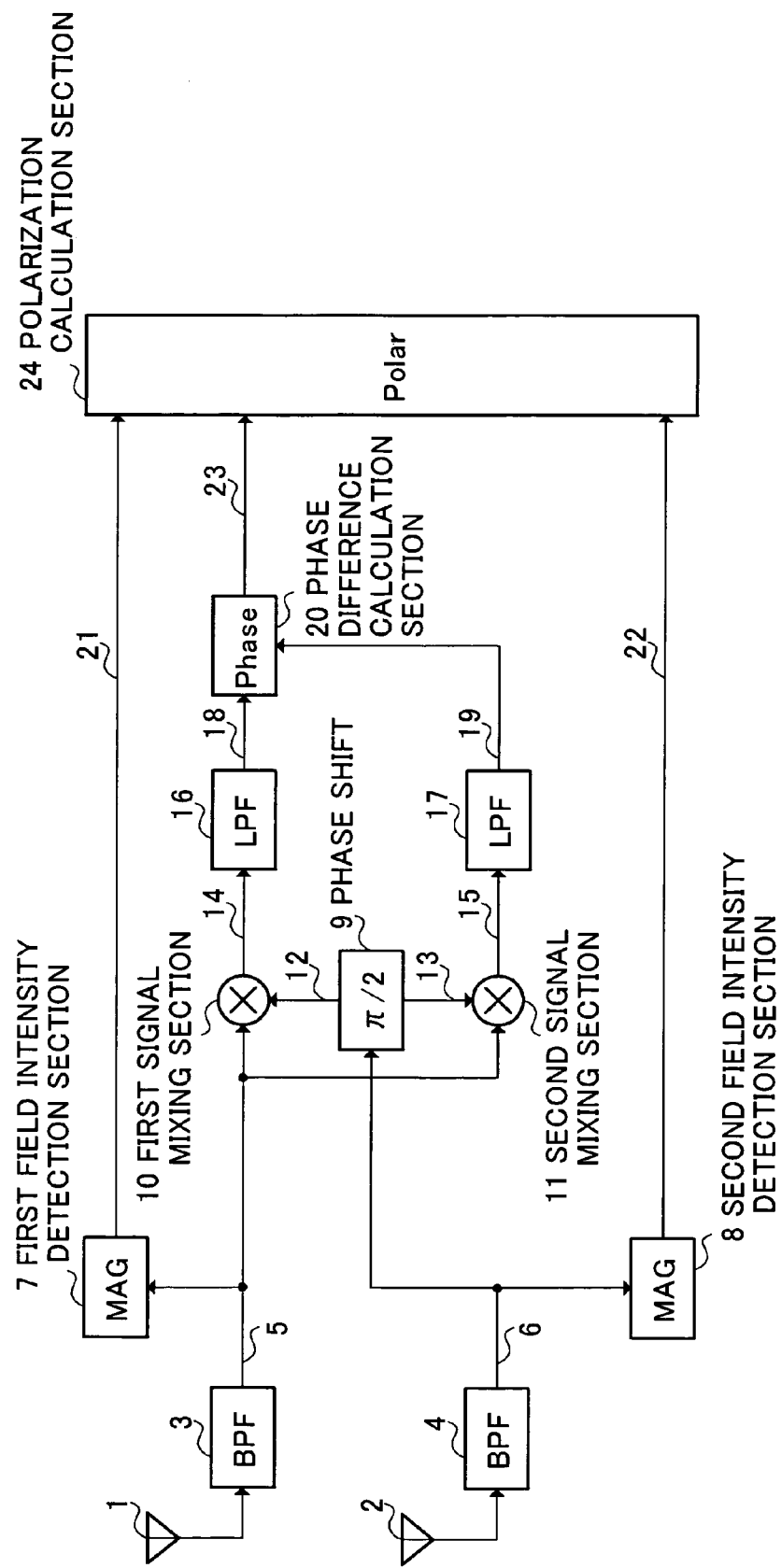
FIG. 1 is a block diagram showing a configuration of a polarized wave measuring apparatus according to Embodiment 1 of the present invention.

An essence of the present invention is to measure polarization of radio waves without detecting phase information of a radio wave at a carrier signal frequency by calculating phase differences between received signals received through a plurality of antennas whose planes of polarization are orthogonal to one another based on a signal obtained by mixing the received signals and a signal obtained by phase-shifting signals received with one plane of polarization 90 degrees and then mixing with signals received with the other plane and calculating polarization of the received signal from this phase difference and reception field intensity of the received signal.

The polarized wave measuring apparatus of the present invention adopts a configuration including a first antenna and a second antenna whose planes of polarization are orthogonal to each other, band restricting means for attenuating any component other than a desired frequency component from a first received signal received from the first antenna and a second received signal received from the second antenna, first mixing means for mixing the first received signal and the second received signal to generate a first mixed signal, second mixing means for mixing the first received signal and the second received signal which is phase-shifted by one-quarter wavelength to generate a second mixed signal, low pass filtering means for eliminating high-frequency areas other than a baseband area from the first mixed signal and the second mixed signal, phase difference calculating means for calculating a phase difference between the first received signal and second received signal from the first mixed signal and the second mixed signal stripped of the high-frequency areas, field intensity measuring means for measuring the field intensities of the first received signal and second received signal with components other than the desired frequency component attenuated, and polarization calculating means for calculating polarization of the received waves from the field intensities of the first received signal and the second received signal, and the phase difference.

According to this configuration, by calculating phase differences between received signals received through a plurality of antennas whose planes of polarization are orthogonal to one another based on a signal obtained by mixing the received signals and a signal obtained by phase-shifting signals received with one plane of polarization 90 degrees and then mixing with signals received with the other plane and calculating polarization of the received signal from this phase difference and reception field intensity of the received signal, it is possible to measure polarization of the radio wave without detecting phase information of the radio wave at a carrier signal frequency.

The polarized wave measuring apparatus of the present invention adopts a configuration of a polarized wave measuring apparatus according to claim 1, wherein the band restricting means includes amplitude restricting/amplifying means for amplifying the first received signal and the second received signal with components other than a desired frequency component attenuated and converting those received signal to binary signals and the mixing means mixes the first received signal and the second received signal which have been amplified and converted to binary signals.

According to this configuration, by calculating phase differences between received signals received through a plurality of antennas whose planes of polarization are orthogonal to one another based on a signal obtained by amplifying the amplitudes of the received signals and mixing the amplified received signals and a signal obtained by phase-shifting signals received with one plane of polarization 90 degrees and then mixing with signals received with the other plane, it is possible to prevent the sensitivity of the received signals when their amplitudes are small from deteriorating, accurately detect phase differences between signals received through the plurality of antennas and accurately measure polarization of radio waves in a simple configuration.

The polarized wave measuring apparatus of the present invention adopts a configuration of the polarized wave measuring apparatus according to claim 1 or 2, wherein the phase difference calculating means calculates, when it is assumed that the first baseband signal is e1(t), the second baseband signal is e2(t), an angle formed by the coordinates with the e1 (t) corresponding to the x-axis and the e2(t) corresponding to the y-axis of an xy coordinate system whose two axes are orthogonal to each other with respect to the coordinate axis is $\phi$ (t), the result of subtracting $\phi$ (0), a reference angle, which corresponds to $\phi$ (t) when the first antenna and the second antenna receive signals of the same phase, from $\phi$ (t) as the phase difference $\phi$ between the first baseband signal and second baseband signal during measurement, and outputs this calculation result as the phase difference to the polarization calculating means.

According to this configuration, it is possible to extract a phase difference between the first baseband signal and second baseband signal as angle information.

The polarized wave measuring apparatus of the present invention adopts a configuration of the polarized wave measuring apparatus according to claim 3, wherein the polarization calculating means calculates, with respect to an ellipse which is inscribed in an area formed of 4 points (e1 (t), e2 (t)), (e1 (t), −e2 (t)), (−e1 (t) −e2 (t)) and (−e1 (t), e2 (t)) mapped onto the xy coordinate system, length a of the major axis, length b of the minor axis of the ellipse and angle $\theta$ formed by the x-coordinate axis of the xy coordinate system with respect to the major axis of the ellipse, which are determined by the following expressions:

$$c = e1\ (t)$$

$$d = e2\ (t)$$

$$(\varepsilon = c^2 + d^2, \delta = c^2 d^2 \sin^2 \phi)$$

$$a = \sqrt{\frac{\varepsilon + \sqrt{\varepsilon^2 - 4\delta}}{2}}$$

$$b = \sqrt{\frac{\varepsilon - \sqrt{\varepsilon^2 - 4\delta}}{2}}$$

$$\theta = \tan^{-1} \frac{\varepsilon c d \cos\phi}{b^2 d^2 - a^2 c^2}$$

calculates a polarization axial ratio from the length a of the major axis and length b of the minor axis and determines the inclination of polarization from the angle $\theta$.

According to this configuration, by calculating phase differences between received signals received through a plurality of antennas whose planes of polarization are orthogonal to one another based on a signal obtained by mixing the received signals and a signal obtained by phase-shifting signals received with one plane of polarization 90 degrees and then mixing with signals received with the other plane and calculating polarization of the received signal from this phase difference and reception field intensity of the received signal, it is possible to measure polarization of radio waves without detecting phase information of the radio waves at a carrier signal frequency.

The antenna characteristic measuring apparatus of the present invention adopts a configuration including the polarized wave measuring apparatus according to any one of claims 1 to 5 whose first antenna and second antenna are narrow directional antennas oriented in the same direction having reception planes of polarization orthogonal to each other, an antenna under measurement located at a distance at which a remote field is formed in the orientations of the first antenna and second antenna, rotating means for rotating the antenna under measurement, controlling means for generating a rotation control signal that controls a set angle within a single plane of the rotating means and recording means for recording the result of measurement of the polarized wave measuring apparatus in association with the set angle obtained from the rotation control signal.

According to this configuration, it is possible to evaluate antenna directivity including polarization by measuring the antenna characteristic while changing the posture of the antenna under measurement.

The radio wave measuring apparatus of the present invention adopts a configuration including the polarized wave measuring apparatus according to any one of claims 1 to 5 whose first antenna and second antenna are narrow directional antennas oriented in the same direction, rotating means for rotating the first antenna and second antenna, controlling means for generating a rotation control signal that controls a set angle within one plane of the rotating means and recording means for recording the result of measurement of the polarized wave measuring apparatus in association with the set angle obtained from the rotation control signal.

The polarization measuring method of the present invention adopts a configuration including a receiving step of receiving radio waves through a first antenna and second antenna whose planes of polarization are orthogonal to each other, a band restricting step of attenuating any component other than a desired frequency component from a first received signal received from the first antenna and a second received signal received from the second antenna, a first mixing step of mixing the first received signal and the second received signal to generate a first mixed signal, a second mixing step of mixing the first received signal and the second received signal which is phase-shifted by one-quarter wavelength to generate a second mixed signal, a low pass filtering step of eliminating high-frequency areas other than a baseband area from the first mixed signal and the second mixed signal, a phase difference calculating step of calculating a phase difference between the first received signal and the second received signal from the first mixed signal and second mixed signal stripped of the high-frequency areas, a field intensity measuring step of measuring the field intensities of the first received signal and second received signal with components other than the desired frequency component attenuated, and a polarization calculating step of calculating polarization of the received signal from the field intensities of the first received signal and second received signal.

According to this method, by calculating phase differences between received signals received through a plurality of antennas whose planes of polarization are orthogonal to one another based on a signal obtained by mixing the received signals and a signal obtained by phase-shifting signals received with one plane of polarization 90 degrees and then mixing with signals received with the other plane and calculating polarization of the received signal from this phase difference and reception field intensity of the received signal, it is possible to measure polarization of the radio wave without detecting phase information of the radio wave at a carrier signal frequency.

With reference now to the attached drawings, embodiments of the present invention will be explained in detail below.

EMBODIMENT 1

FIG. 1 is a block diagram showing a configuration of a polarized wave measuring apparatus according to a first embodiment of the present invention. This polarized wave measuring apparatus is a polarized wave measuring apparatus amounted on a radio wave measuring apparatus. The polarized wave measuring apparatus in FIG. 1 is mainly constructed of a first antenna 1, a second antenna 2, a first signal band restriction section 3, a second signal band restricting section 4, a first field intensity detection section 7, a second field intensity detection section 8, a phase shift section 9, a first signal mixing section 10, a second signal mixing section 11, a first low pass filtering section 16, a second low pass filtering section 17, a phase difference calculation section 20 and a polarization calculation section 24.

The first antenna 1 receives a radio wave and outputs the radio signal to the first signal band restriction section 3. The second antenna 2 receives a radio wave as a polarized wave, which is orthogonal to the polarized wave of the first antenna 1 and outputs the received signal to the second signal band restriction section 4. This embodiment will be explained using an example assuming that the first antenna is a vertical polarization antenna and the second antenna is a horizontal polarization antenna. If the antennas used here are directional antennas, the subsequent data processing will be simpler. For example, it is preferable to use elements of a so-called "cross Yagi antenna" as the first antenna 1 and second antenna 2.

The first signal band restriction section 3 restricts the signal band by attenuating any signal other than a signal of a desired frequency band from the signal received through the first antenna 1 and outputs the band-restricted signal 5 whose signal band has been restricted to the first field intensity detection section 7, the first signal mixing section 10 and the second signal mixing section 11.

Likewise, the second signal band restriction section 4 restricts the signal band by attenuating any signal other than a signal of a desired frequency band from the signal received through the second antenna 2 and outputs the band-restricted signal 6 whose signal band has been restricted to the second field intensity detection section 8 and the phase shift section 9. These first signal band restriction section 3 and second signal band restriction section 4 are constructed of band pass filters, etc.

The first field intensity detection section 7 detects reception field intensity at the first antenna 1 from the power of the band-restricted signal 5 and supplies this reception field intensity 21 to the polarization calculation section 24. Likewise, the second field intensity detection section 8 detects reception field intensity at the second antenna 2 from the power of the band-restricted signal 6 and supplies this reception field intensity 22 to the polarization calculation section 24.

The phase shift section 9 phase-shifts the second band-restricted signal 6 to a first phase-shifted signal 12 and a phase-shifted signal 13 whose phase is different from the phase of the first phase-shifted signal by 90 degrees. Then, the phase shift section 9 outputs the first phase-shifted signal 12 to the first signal mixing section 10 and outputs the second phase-shifted signal 22 to the second signal mixing section 11.

Here, suppose the phase shift section 9 generates COS($\omega t+\phi+\xi$) as the first phase-shifted signal 12 having a 90-degree phase difference and SIN($\omega t+\phi+\xi$) as the second phase-shifted signal 13.

The first signal mixing section 10 mixes the first band-restricted signal 5 and the first phase-shifted signal 12 and outputs a first mixed signal 14 to the first low pass filtering section 16. Here, suppose the first band-restricted signal 5 is COS(ωt) and the second band-restricted signal 6 is COS(ωt+φ). ω is a carrier frequency of the received signal, φ is a phase difference between the first band-restricted signal 5 and second band-restricted signal 6.

Likewise the second mixing section 11 mixes the second band-restricted signal 6 and the second phase-shifted signal 13 and outputs the second mixed signal 15 to the second low pass filtering section 17. When the above-described definition is applied, the first mixed signal 14 is COS(φ+ξ)+COS(2ωt+φ+ξ) and the second mixed signal 15 is SIN(φ+ξ)+SIN(2ωt+φ+ξ).

The first low pass filtering section 16 attenuates and eliminates a high-frequency area which is higher than a desired baseband frequency from the first mixed signal 14, and obtains COS(φ+ξ) as the first baseband signal 18. Then, the first low pass filtering section 16 outputs this first baseband signal 18 to the phase difference calculation section 20.

Likewise, the second low pass filtering section 17 attenuates and eliminates a high-frequency area, which is higher than a desired baseband frequency from the second mixed signal 15, and obtains SIN(φ+ξ) as the second baseband signal 19. Then, the second low pass filtering section 17 outputs this second baseband signal 19 to the phase difference calculation section 20.

Here, φ+ξ can be obtained from these first and second baseband signals 18 and 19 through a simple calculation using an inverse function of TAN. Using this calculation, the phase difference calculation section 20 retains an initial angle ξ when the received signals at the first and second antennas have the same phase (φ=0) beforehand, calculates a phase difference by subtracting the initial angle ξ from the angle φ+ξ obtained and calculates a phase difference value 23. Then, the phase difference calculation section 20 supplies the phase difference value 23 to the polarization calculation section 24.

The polarization calculation section 24 obtains reception polarization from the first reception field intensity value 21, second reception field intensity value 22 and phase difference value 23. This reception polarization can be defined based on the axial ratio of the polarization and inclination of the polarization. The calculation of reception polarization will be explained in detail below.

Figure 2:
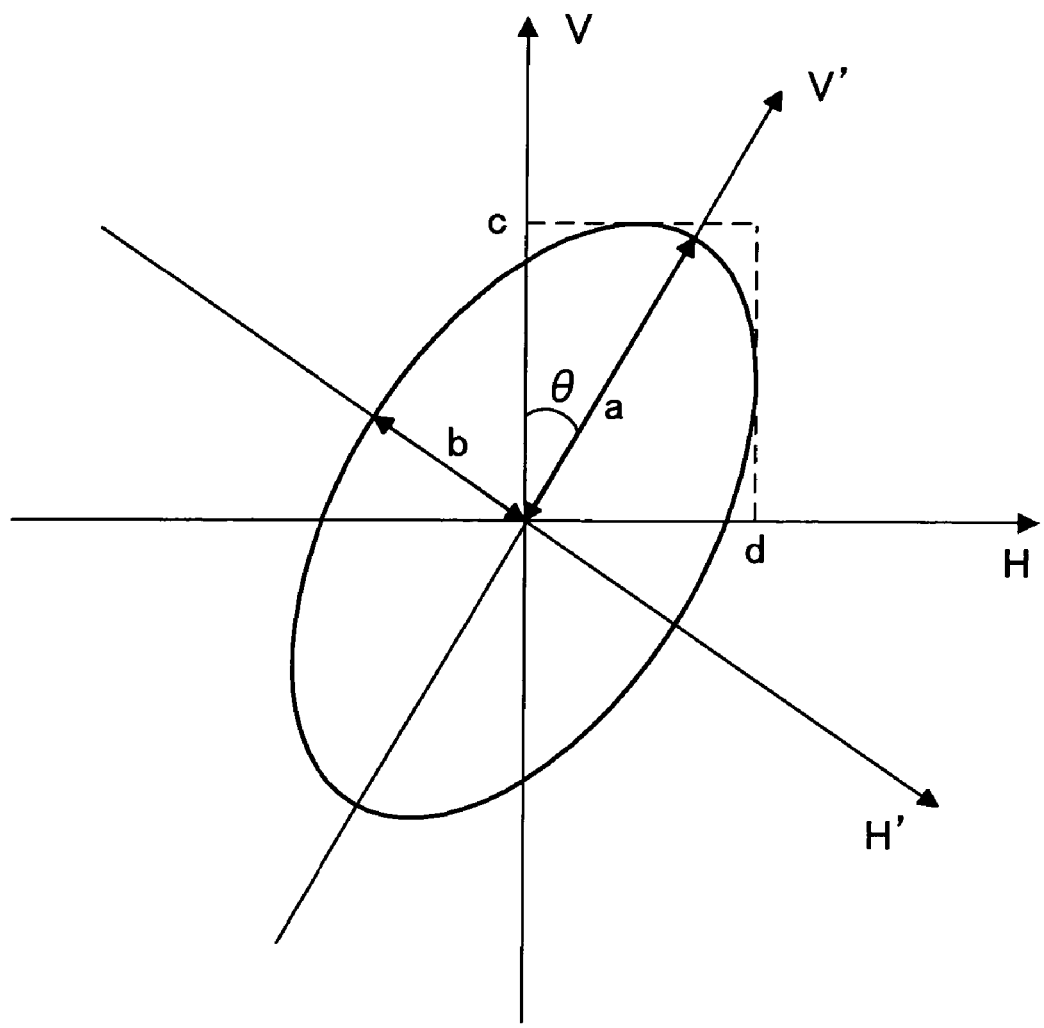
FIG. 2 illustrates a calculation example of polarization of a received radio wave.

FIG. 2 illustrates a calculation example of polarization of a received radio wave. An example of the method of calculating the axial ratio of the reception polarization and inclination of the polarization at the polarization calculation section 24 will be explained using FIG. 2.

Here, when it is assumed that the first reception field intensity value 21 is e1 (t), the second reception field intensity value is e2 (t) at a time t, and with respect to an ellipse which is inscribed in an area formed of 4 points (e1 (t), e2 (t)), (e1 (t), −e2 (t)), (−e1 (t), −e2 (t)) and (−e1 (t), e2 (t)) mapped onto a coordinate system shown in FIG. 2, if:

$$c = e1(t)$$

$$d = e2(t)$$

$$(\varepsilon = c^2 + d^2, \delta = c^2 d^2 \sin^2 \phi)$$ [Mathematical expression 1]

then, the reception polarization can be obtained on the coordinate axis as:

[Mathematical Expression 2]

$$a = \sqrt{\frac{\varepsilon + \sqrt{\varepsilon^2 - 4\delta}}{2}}$$

$$b = \sqrt{\frac{\varepsilon - \sqrt{\varepsilon^2 - 4\delta}}{2}}$$

$$\theta = \tan^{-1} \frac{\varepsilon c d \cos\phi}{b^2 d^2 - a^2 c^2}$$

That is, it is possible to obtain the axial ratio of polarization from the length a of the major axis and length b of the minor axis of the ellipse.

Then, it is possible to obtain the inclination of the ellipse with respect to the coordinate system, that is, angle θ formed by the major axis of the ellipse and the x coordinate axis. This angle θ becomes the polarization of the received signal.

Thus, according to the radio wave measuring apparatus of this embodiment, by calculating phase differences between received signals received through a plurality of antennas whose planes of polarization are orthogonal to one another based on a signal obtained by mixing the received signals and a signal obtained by phase-shifting signals received with one plane of polarization 90 degrees and then mixing with signals received with the other plane and calculating polarization of the received signal from this phase difference and reception field intensity of the received signal, of the received signal, it is possible to measure polarization of radio waves without detecting phase information of the radio waves at a carrier signal frequency.

The phase difference calculation section 20 in FIG. 1 performs processing using only the phase information on the band restriction signals 5 and 6, and therefore their amplitudes may be arbitrary. Furthermore, amplitude variations of the input signal at the signal mixing section 10 and signal mixing section 11 cause amplitude variations of the output signal and deterioration of the sensitivity may be expected when the amplitudes are small.

Figure 3:
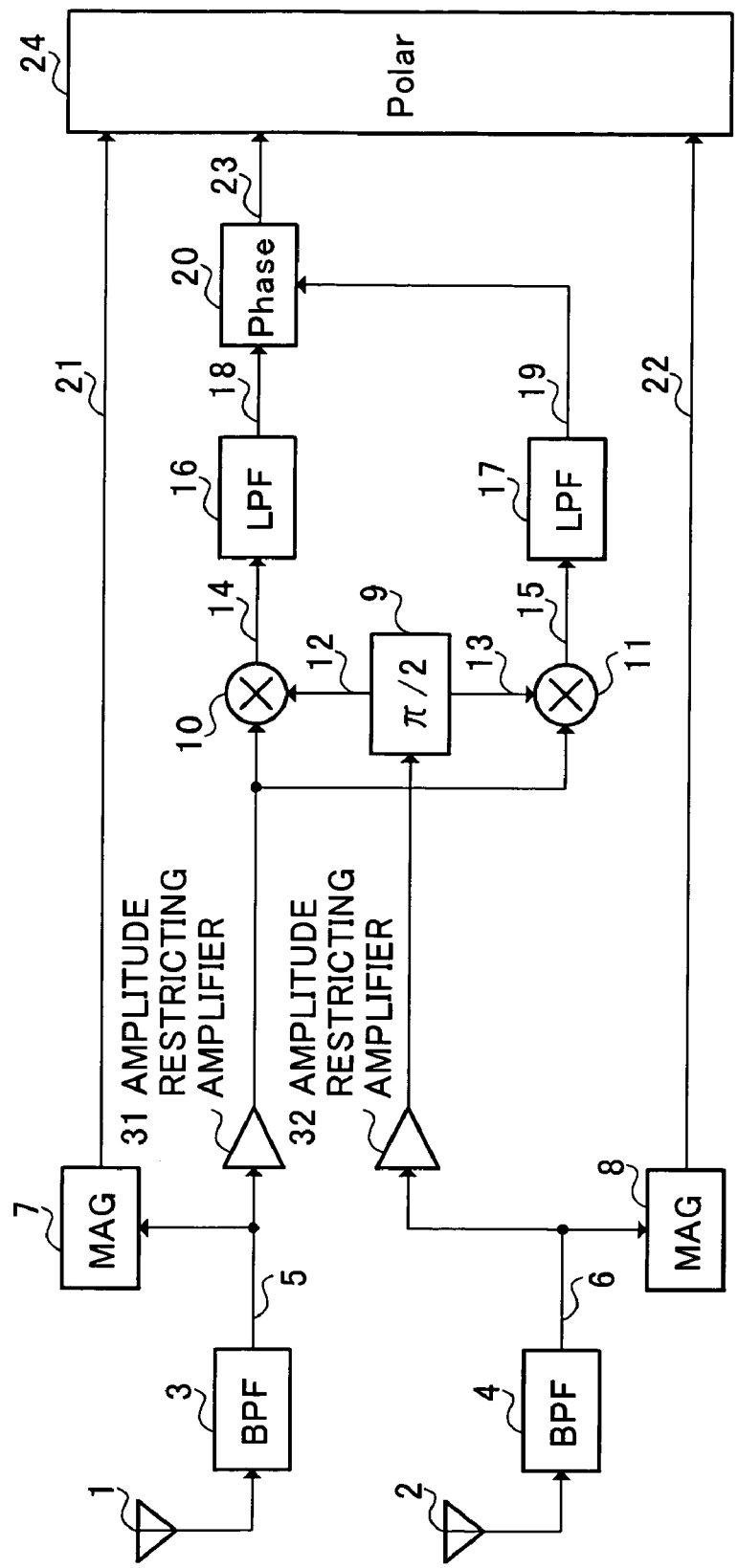
FIG. 3 is a block diagram showing a configuration of the polarized wave measuring apparatus of the above embodiment.

Therefore, it is preferable that the amplitudes of the input signals at the signal mixing section 10 and signal mixing section 11 do not fluctuate but remain constant. A configuration for improving the detection sensitivity of the polarized wave measuring apparatus will be explained below. FIG. 3 is a block diagram showing a configuration of the polarized wave measuring apparatus of this embodiment. The polarized wave measuring apparatus in FIG. 3 is different from the polarized wave measuring apparatus in FIG. 1 in that it is provided with an amplitude restricting amplifier 31 and an amplitude restricting amplifier 32 to amplify the amplitudes of received signals used for phase shift calculations.

The first signal band restriction section 3 restricts the signal band by attenuating any signal other than a signal of a desired frequency band from the signal received through the first antenna 1 and outputs the band-restricted signal 5 whose signal band has been restricted to the first field intensity detection section 7 and the amplitude restricting amplifier 31.

Likewise, the second signal band restriction section 4 restricts the signal band by attenuating any signal other than a signal of a desired frequency band from the signal received through the second antenna 2 and outputs the band-restricted signal 6 whose signal band has been restricted to the second field intensity detection section 8 and the amplitude restricting amplifier 32.

The amplitude restricting amplifier 31 amplifies the amplitude of the received signal output from the first signal band restriction section 3 to a certain amplitude value and outputs the amplified received signal to the first signal mixing section 10 and second signal mixing section 11. The amplitude restricting amplifier 32 amplifies the amplitude of the received signal output from the second signal band restriction section 4 to a certain amplitude value and outputs the amplified received signal to the phase shift section 9. The amplitude restricting amplifier 31 and amplitude restricting amplifier 32 amplify the amplitudes to a size necessary to detect a phase difference between signals.

Here, the phase shift section 9 generates $COS(\omega t+\phi+\xi)$ from the second band-restricted signal 6 whose amplitude has been amplified at the amplitude restricting amplifier 32 as a first phase-shifted signal 12 with a 90-degree phase difference, and $SIN(\omega t+\phi+\xi)$ as the second phase-shifted signal 13.

The first signal mixing section 10 mixes the first band-restricted signal 5 whose amplitude has been amplified at the amplitude restricting amplifier 31 and the first phase-shifted signal 12 and outputs the first mixed signal 14 to the first low pass filtering section 16.

Likewise, the second signal mixing section 11 mixes the second band-restricted signal 6 whose amplitude has been amplified at the amplitude restricting amplifier 31 and the second phase-shifted signal 13 and outputs the second mixed signal 15 to the second low pass filtering section 17.

Thus, according to the radio wave measuring apparatus of this embodiment, by amplifying the amplitudes of signals received through a plurality of antennas whose planes of polarization are orthogonal to one another and calculating phase differences between the received signals from a signal obtained by mixing among the amplified received signals and a signal obtained by mixing one received signal whose phase is shifted 90 degrees with another signal, it is possible to prevent deterioration of the sensitivity of the received signals when their amplitudes are small, accurately detect the phase difference of the received signals received through the plurality of antennas and accurately measure polarization of radio waves in a simple configuration.

EMBODIMENT 2

Embodiment 2 will describe a case where polarization of radio waves arriving from various directions is measured using the polarized wave measuring apparatus of Embodiment 1.

Figure 4:
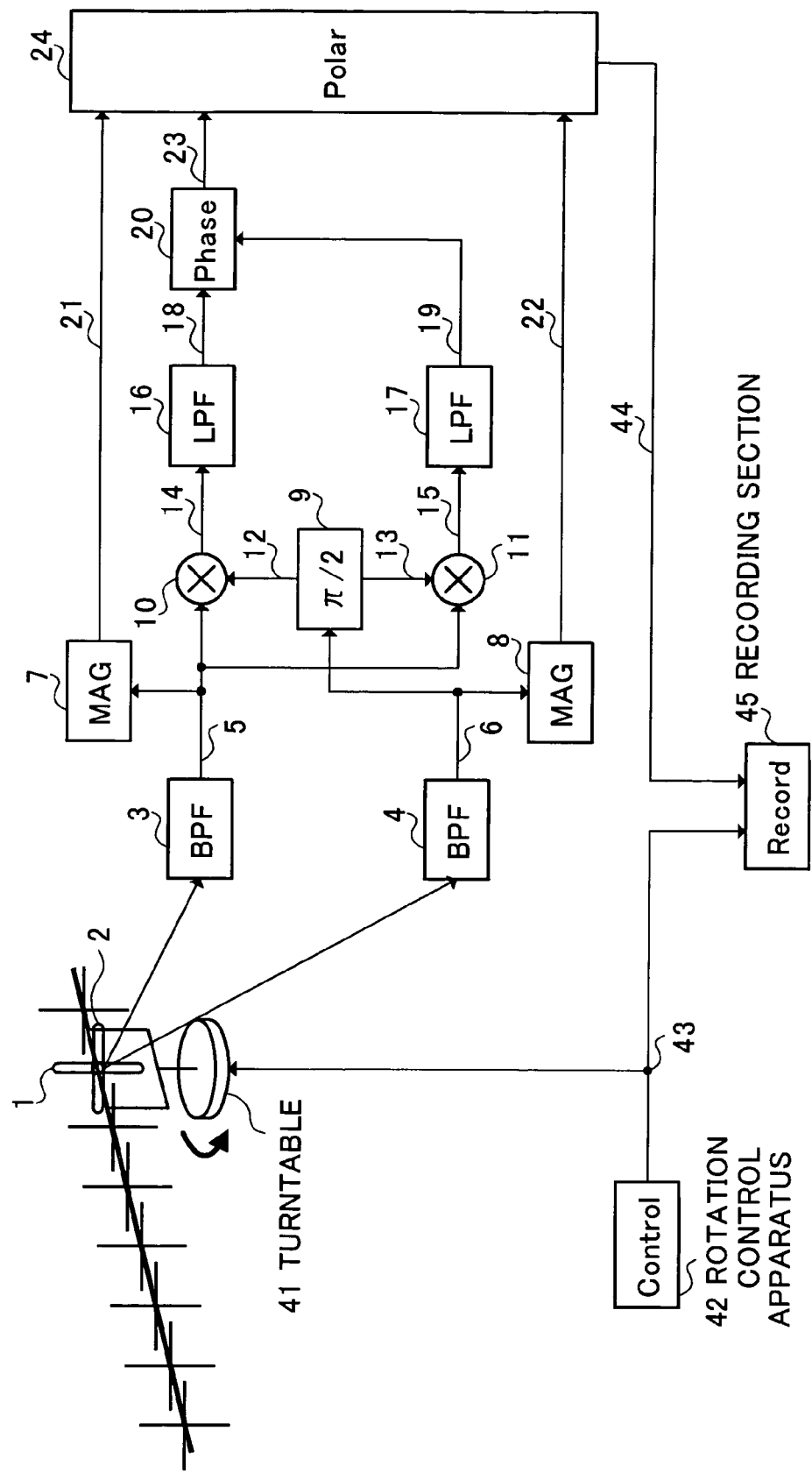
FIG. 4 is a block diagram showing a configuration of a polarized wave measuring apparatus according to Embodiment 2 of the present invention.

FIG. 4 is a block diagram showing a configuration of a radio wave measuring apparatus according to Embodiment 2 of the present invention. However, the same components as those in FIG. 1 are assigned the same reference numerals and detailed explanations thereof will be omitted. The radio wave measuring apparatus in FIG. 4 is different from the radio wave measuring apparatus in FIG. 1 in that it is provided with a turntable 41, a rotation control apparatus 42 and a recording section 45, measures polarization by rotating an antenna and records the result of polarization measurement by associating the antenna rotation angle with polarization.

This embodiment will describe an example where the radio wave measuring apparatus uses a cross Yagi antenna for a first antenna 1 and second antenna 2.

The turntable 41 rotates by an arbitrary angle instructed by a control signal 43, which is output from the rotation control apparatus 42 and changes the orientations of the first antenna 1 and second antenna 2. As a result, the angles of orientation of the first antenna 1 and second antenna 2 vary.

The rotation control apparatus 42 outputs the control signal 43 including an instruction of the rotation angle of the turntable 41 to the turntable 41 and recording section 45.

The recording section 45 stores the polarization output from a polarization calculation section 24 in association with the rotation angle included in the control signal 43 output from the rotation control apparatus 42.

Then, the operation of the radio wave measuring apparatus according to the present invention will be explained using FIG. 4 below.

The turntable 41 holds the cross Yagi antenna made up of the first antenna 1 and second antenna 2 so that the power supply point is located at the center of rotation. Here, a case where the first antenna 1 is set vertically, the second antenna 2 is set horizontally and the turntable 41 rotates within a horizontal plane will be explained. The turntable 41 directs the cross Yagi antenna in an arbitrary direction on the horizontal plane through the rotation control signal 43 supplied from the rotation control apparatus 42.

The recording section 45 records the rotation angle indicated by the rotation control signal 43 in association with the polarization calculation result 44, making it possible to measure a signal arriving from any given angle within the horizontal plane from the orientation of the cross Yagi antenna and the polarization calculation result of the reception result.

Here, by dividing the circumference of the rotation section at regular intervals of a sufficiently small angle, successively recording the results of polarization calculations at their respective set angles for 360 degrees, it is possible, with the configuration shown in FIG. 4, to measure polarization characteristics of radio waves arriving from all directions within the horizontal plane.

Thus, according to the radio wave measuring apparatus of this embodiment, by rotating the antennas, measuring polarization and recording the result of measurement of polarization by associating the rotation angle of the antenna with polarization, it is possible to measure the polarization characteristics of radio waves arriving from all directions within the plane of rotation of the antenna By the way, the above-described explanation has quoted an example of the cross Yagi antenna whose first antenna 1 and second antenna 2 are placed vertically and horizontally, respectively, but the present invention is likewise applicable to a case where the antenna elements are placed diagonally if at least polarization orthogonality is maintained between the first and second antennas.

Furthermore, this embodiment has explained the radio wave measuring apparatus as having the configuration shown in FIG. 1, but it is obvious, as explained in Embodiment 1, that adopting the configuration in FIG. 3 instead makes it possible to improve the measuring sensitivity characteristic of the apparatus.

EMBODIMENT 3

Figure 5:
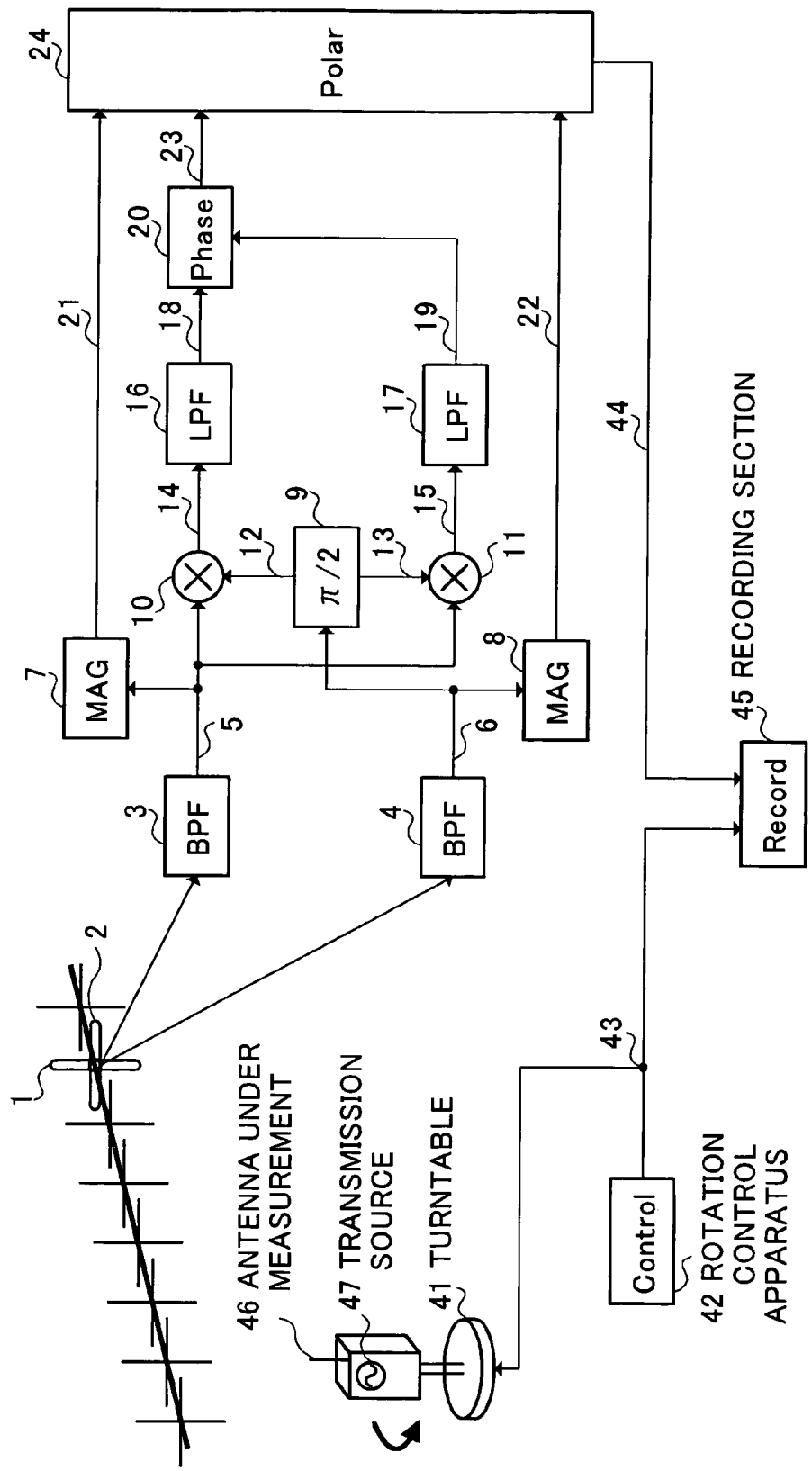
FIG. 5 is a block diagram showing a configuration of an antenna characteristic measuring apparatus of this embodiment.

Embodiment 3 will describe an example where the antenna characteristic will be measured using the polarized wave measuring apparatus of Embodiment 1. FIG. 5 is a block diagram showing a configuration of an antenna characteristic measuring apparatus of this embodiment. However, the same components as those in FIG. 1 or FIG. 3 are assigned the same reference numerals in FIG. 1 or FIG. 3 and detailed explanations thereof will be omitted.

The antenna characteristic measuring apparatus in FIG. 5 is different from the radio wave measuring apparatuses in FIG. 1 and FIG. 2 in that it is provided with an antenna under measurement 46 and a transmission source 47, directs the antenna for measuring polarization toward the antenna under measurement, rotates the antenna under measurement and measures the antenna gain characteristic including polarization at an arbitrary angle within the rotation plane.

More specifically, a cross Yagi antenna (first antenna 1 and second antenna 2) is fixed, the antenna under measurement 46 is placed on a turntable 41 and set in the direction of directivity of the cross Yagi antenna.

The cross Yagi antenna made up of the first antenna 1 and second antenna 2 is placed with its directivity fixed toward the antenna under measurement 46.

The antenna under measurement 46 and transmission source 47 are set on the turntable 41 and rotatable. The antenna under measurement 46 is placed so that the power supply point is set at the center of rotation of the turntable 41. The transmission source 47 excites the antenna under measurement 46.

The operation of the antenna characteristic measuring apparatus of the present invention will be explained using FIG. 5.

The turntable 41 can direct the antenna under measurement 46 in any given direction on the horizontal plane through a rotation control signal 43 supplied from the rotation control apparatus 42. Furthermore, the recording section 45 records the rotation angle indicated by the rotation control signal 43 in association with a polarization calculation result 44, and can thereby measure the antenna gain characteristic including polarization at an arbitrary angle within the horizontal plane from the rotation direction of the antenna under measurement 46 and the polarization calculation result of the reception result.

Here, by dividing the circumference of the rotation section at regular intervals of a sufficiently small angle, successively recording the results of polarization calculations at their respective set angles for 360 degrees, the configuration shown in FIG. 5 makes it possible to measure the antenna gain characteristics including the polarization characteristic in all directions within the horizontal plane.

Thus, the antenna characteristic measuring apparatus of this embodiment carries out measurements while changing the posture of the antenna under measurement, and can thereby evaluate antenna directivity including polarization.

By the way, the above embodiment has been explained using an example where the antenna under measurement 46 is excited by the transmission source 47 incorporated in the same housing, but the embodiment can also be implemented when the transmission source is provided outside and power is supplied from the outside.

Furthermore, it is obvious that antenna directivity including polarizations on the XY plane, YZ plane and XZ plane can be measured by changing the setting direction of the antenna under measurement 46 on the turntable 41.

This embodiment has described the polarized wave measuring apparatus in the configuration shown in FIG. 1, but it is, as explained in Embodiment 1, obvious that adopting the configuration in FIG. 3 instead can improve the measurement sensitivity characteristic of the apparatus.

EMBODIMENT 4

Figure 6:
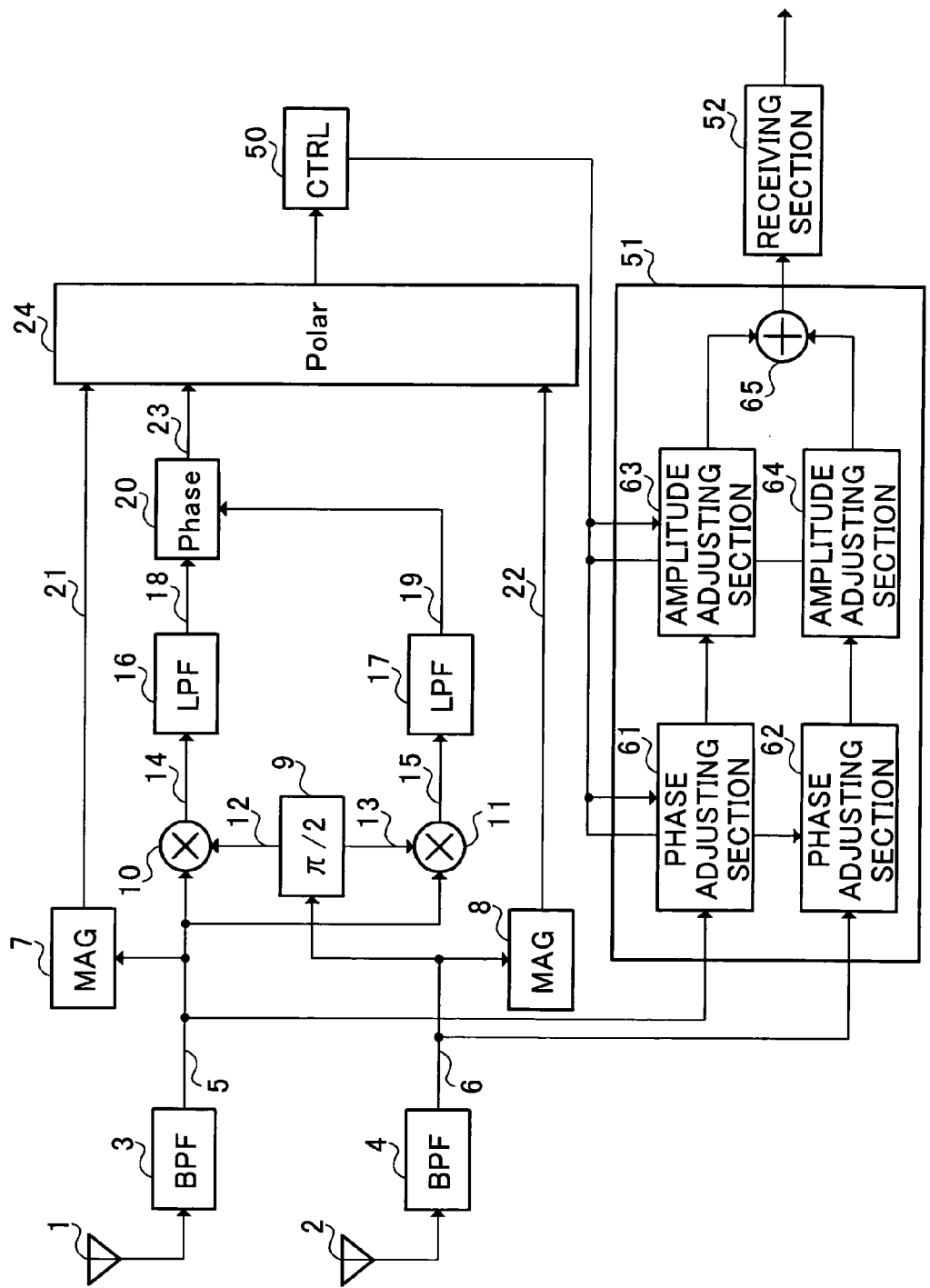
FIG. 6 is a block diagram showing a configuration of a radio communication apparatus according to Embodiment 4 of the present invention.

Embodiment 4 will describe a case where the polarized wave measuring apparatus according to Embodiment 1 is mounted on a radio communication apparatus. FIG. 6 is a block diagram showing a configuration of a radio communication apparatus according to Embodiment 4 of the present invention. Here, the same components as those in FIG. 1 are assigned the same reference numerals as those in FIG. 1 and detailed explanations thereof will be omitted.

The radio communication apparatus in FIG. 6 is different from the polarized wave measuring apparatus in FIG. 1 in that this radio communication apparatus includes a control section 50, a combination section 51 and a reception section 52, and corrects radio signals received through a plurality of antennas and demodulates the corrected radio signals based on polarization information obtained from the polarized wave measuring apparatus.

The control section 50 calculates amounts of correction of the phase and amplitude of the received signals received through the antenna 1 and antenna 2 based on the polarization information obtained from the polarization calculation section 24 and instructs the combination section 51 to correct the phase and amplitude of the received signals. For example, the control section 50 calculates a phase difference and amplitude ratio of the received signals received through the antenna 1 and antenna 2 and instructs the combination section 51 about the phase difference and amplitude ratio as correction values.

The combination section 51 corrects the phase and amplitude of the received signals received through the antenna 1 and antenna 2 according to an instruction of the control section 50, adds up the corrected received signals and outputs to the reception section 52. The reception section 52 converts the received signal output from the combination section 51 to a baseband frequency and demodulates it.

Then, an internal configuration of the combination section 51 will be explained. The combination section 51 is constructed of a phase adjusting section 61, a phase adjusting section 62, an amplitude adjusting section 63, an amplitude adjusting section 64 and an addition section 65.

The phase adjusting section 61 changes the phase of the received signal output from the first signal band restriction section 3 according to an instruction of the control section 50 and outputs to the amplitude adjusting section 63. Likewise, the phase adjusting section 62 changes the phase of the received signal output from the second signal band restriction section 4 according to an instruction of the control section 50 and outputs to the amplitude adjusting section 64.

The amplitude adjusting section 63 changes the amplitude of the received signal output from the phase adjusting section 61 according to an instruction of the control section 50 and outputs to the addition section 45. Likewise, the amplitude adjusting section 64 changes the amplitude of the received signal output from the phase adjusting section 62 according to an instruction of the control section 50 and outputs to the addition section. 65.

The combination section 65 adds up the received signal output from the amplitude adjusting section 63 and the received signal output from the amplitude adjusting section 64 and outputs to the reception section 52.

Thus, according to the radio communication apparatus of this embodiment, by correcting radio signals received through a plurality of antennas and demodulating the corrected radio signals based on the polarization information obtained from the polarized wave calculation apparatus, it is possible to receive a radio signal to which the polarization characteristic adjusted, and it is possible to improve to receive sensitivity.

The present invention is not limited to the above-described embodiments but can also be implemented modified in various ways. For example, the above-described embodiments have described the case where the present invention is implemented as the polarized wave measuring apparatus, but the present invention is not limited to this and this polarization measuring method can also be implemented by software.

For example, it is also possible to store a program for executing the above-described polarization measuring method in a ROM (Read only Memory) beforehand and operate the program by a CPU (Central Processor Unit)

Furthermore, it is also possible to store a program for executing the above-described polarization measuring method in a computer-readable storage medium and record the program stored in the storage medium in a RAM (Random Access Memory) of a computer and operate the computer according to the program.

As is apparent from the above explanations, according to the radio wave measuring apparatus of the present invention, by calculating phase differences between received signals received through a plurality of antennas whose planes of polarization are orthogonal to one another based on a signal obtained by mixing the received signals and a signal obtained by phase-shifting signals received with one plane of polarization 90 degrees and then mixing with signals received with the other plane and calculating polarization of the received signal from this phase difference and reception field intensity of the received signal, it is possible to implement an apparatus for measuring/evaluating radio wave characteristics of not only power of the radio waves but also polarization in a simple configuration.

Furthermore, according to the polarized wave measuring apparatus of the present invention, it is possible to measure polarization continuously and measure time-varying polarization.

Therefore, by continuously measuring polarization while changing the directions of reception antennas of the polarized wave measuring apparatus of the present invention, it is possible to measure incoming radio waves in the directivity direction of the reception antennas. For example, when the reception antenna is rotated within the horizontal plane, it is possible to construct a polarization measuring system of incoming radio waves within the horizontal plane. Thus, when applied to measurements of radio waves in a communication area, the polarized wave measuring apparatus of the present invention can grasp a more realistic situation of incoming radio signals.

Furthermore, the apparatus of the present invention can evaluate antenna directivity including polarization by carrying out measurements while changing the posture of the antenna under measurement.

It is also possible to improve the sensitivity of polarization detection with the apparatus of the present invention.

It is also possible to improve the sensitivity of reception of the radio communication apparatus by applying the apparatus of the present invention to radio communications apparatus.

This application is based on the Japanese Patent Application No.2002-050977 filed on Feb. 27, 2002, and the Japanese Patent Application No.2003-049918 filed on Feb. 26, 2003 entire content of which is expressly incorporated by reference herein.

Industrial Applicability

The present invention is preferably used for a measuring apparatus applied to evaluations of antennas used for radio communication equipment.

What is claimed is:

1. A polarized wave measuring apparatus comprising:
a first antenna and a second antenna whose planes of reception polarization are orthogonal to each other;
band restricting means for attenuating any component other than a desired frequency component from a first received signal received from said first antenna and a second received signal received from said second antenna;
first mixing means for mixing said first received signal and said second received signal to generate a first mixed signal;
second mixing means for mixing said first received signal and the second received signal, which is phase-shifted by one-quarter wavelength to generate a second mixed signal;
low pass filtering means for eliminating high-frequency areas other than a baseband area from said first mixed signal and said second mixed signal;
phase difference calculating means for calculating a phase difference between said first received signal and second received signal from the first mixed signal and the second mixed signal stripped of these high-frequency areas;
field intensity measuring means for measuring the field intensities of said first received signal and said second received signal with components other than the desired frequency component attenuated; and
polarization calculating means for calculating polarization of the received signal from the field intensities of said first received signal and second received signal and said phase difference.

2. The polarized wave measuring apparatus according to claim 1, wherein said band restricting means comprises amplitude restricting/amplifying means for amplifying said first received signal and said second received signal with components other than a desired frequency component attenuated and converting the received signal to binary signals and said mixing means mixes the first received signal and second received signal which have been amplified and converted to binary signals.

3. The polarized wave measuring apparatus according to claim 1, wherein said phase difference calculating means calculates, when it is assumed that the first baseband signal is e1 (t), the second baseband signal is e2 (t), an angle formed by the coordinates with said e1 (t) corresponding to the x-axis and said e2 (t) corresponding to the y-axis of an xy coordinate system whose two axes are orthogonal to each other with respect to the coordinate axis is φ (t), the result of subtracting φ (0), a reference angle, which corresponds to φ (t) when said first antenna and said second antenna receive signals of the same phase, from φ (t) as the phase difference φ between said first baseband signal and second baseband signal during measurement, and outputs this calculation result as the phase difference to the polarization calculating means.

4. The polarized wave measuring apparatus according to claim 3, wherein said polarization calculating means calculates, with respect to an ellipse which is inscribed in an area formed of 4 points (e1 (t), e2 (t)), (e1 (t), −e2 (t)), (−e1 (t), −2(t)) and (−e1 (t), e2 (t)) mapped onto the xy coordinate system, length a of the major axis, length b of the minor axis of the ellipse and angle θ formed by the x-coordinate axis of said xy coordinate system with respect to the major axis of said ellipse, which are determined by the following expressions:

$$c = e1(t)$$

$$d = e2(t)$$

$$(\epsilon = c^2 + d^2, \delta = c^2 d^2 \sin^2 \phi)$$

$$a = \sqrt{\epsilon + \sqrt{\epsilon^2 - 4\delta}/2}$$

$$b = \sqrt{\epsilon - \sqrt{\epsilon^2 - 4\delta}/2}$$

$$\theta = \tan^{-1} \epsilon cd \cos \phi / b^2 d^2 - a^2 c^2$$

calculates a polarization axial ratio from the length a of said major axis and length b of said minor axis and determines the inclination of polarization from said angle $\theta$.

5. An antenna characteristic measuring apparatus comprising:
the polarized wave measuring apparatus according to claim 1 whose said first antenna and said second antenna are narrow directional antennas oriented in the same direction having reception planes of polarization orthogonal to each other;
an antenna under measurement located at a distance at which a remote field is formed in the orientations of said first antenna and second antenna;
rotating means for rotating said antenna under measurement;
controlling means for generating a rotation control signal that controls a set angle within a single plane of said rotating means; and
recording means for recording the result of measurement of said polarized wave measuring apparatus in association with the set angle obtained from said rotation control signal.

6. A radio wave measuring apparatus comprising:
the polarized wave measuring apparatus according to claim 1 whose said first antenna and said second antenna are narrow directional antennas oriented in the same direction;
rotating means for rotating the first antenna and second antenna;
controlling means for generating a rotation control signal that controls the set angle within one plane of said rotating means; and
recording means for recording the result of measurement of said polarized wave measuring apparatus in association with the set angle obtained from said rotation control signal.

7. A radio communication apparatus comprising:
the polarized wave measuring apparatus according to claim 1;
controlling means for instructing corrections of the phase and amplitude of said first antenna and second antenna based on the polarization calculated by the polarization means of said polarized wave measuring apparatus;
combining means for correcting the phase and amplitude of received signals received through said first antenna and said second antenna according to an instruction from said controlling means, assigning weights thereto and then adding up the weighted received signals; and
receiving means for demodulating the received signals added up by said combining means.

8. The radio communication apparatus according to claim 7, wherein said combining means comprising:
amplitude adjusting means for assigning weights to the amplitude values of the received signals received through said first antenna and said second antenna;
phase adjusting means for correcting the phase of the received signals received through said first antenna and said second antenna; and
adding means for adding up the received signals whose amplitude and phase have been adjusted, wherein said receiving means demodulates the received signal resulting from the addition by said adding means.

9. A polarization measuring method comprising:
a receiving step of receiving radio waves through a first antenna and second antenna whose planes of reception polarization are orthogonal to each other;
a band restricting step of attenuating any component other than a desired frequency component from a first received signal received from said first antenna and a second received signal received from said second antenna;
a first mixing step of mixing said first received signal and said second received signal to generate a first mixed signal;
a second mixing step of mixing said first received signal and the second received signal which is phase-shifted by one-quarter wavelength to generate a second mixed signal;
a low pass filtering step of eliminating high-frequency areas other than a baseband area from said first mixed signal and said second mixed signal;
a phase difference calculating step of calculating a phase difference between said first received signal and second received signal from the first mixed signal and second mixed signal stripped of the high-frequency areas;
a field intensity measuring step of measuring the field intensities of said first received signal and said second received signal with components other than the desired frequency component attenuated; and
a polarization calculating step of calculating polarization of the received signal from the field intensities of said first received signal and second received signal and said phase difference.

* * * * *

UNITED STATES PATENT AND TRADEMARK OFFICE
CERTIFICATE OF CORRECTION

PATENT NO. : 7,315,728 B2  Page 1 of 1
APPLICATION NO. : 10/473592
DATED : January 2, 2008
INVENTOR(S) : Toshifumi Tanaka It is certified that error appears in the above-identified patent and that said Letters Patent is hereby corrected as shown below:

On the Title Page at item (56), References Cited, in OTHER PUBLICATIONS, line 6, "XP002443772" should be -- XP002243772 --.

In column 14, line 65 (claim 4, line 5) of the printed patent, "-2(t))" should be -- -e2(t)) --.

Signed and Sealed this

Tenth Day of June, 2008

JON W. DUDAS
*Director of the United States Patent and Trademark Office*

UNITED STATES PATENT AND TRADEMARK OFFICE
CERTIFICATE OF CORRECTION

PATENT NO. : 7,315,728 B2 Page 1 of 1
APPLICATION NO. : 10/473592
DATED : January 1, 2008
INVENTOR(S) : Toshifumi Tanaka It is certified that error appears in the above-identified patent and that said Letters Patent is hereby corrected as shown below:

On the Title Page at item (56), References Cited, in OTHER PUBLICATIONS, line 6, "XP002443772" should be -- XP002243772 --.

In column 14, line 65 (claim 4, line 5) of the printed patent, "-2(t))" should be -- -e2(t)) --.

This certificate supersedes the Certificate of Correction issued June 10, 2008.

Signed and Sealed this

Fifteenth Day of July, 2008

JON W. DUDAS
*Director of the United States Patent and Trademark Office*

UNITED STATES PATENT AND TRADEMARK OFFICE
CERTIFICATE OF CORRECTION

PATENT NO. : 7,315,728 B2  Page 1 of 1
APPLICATION NO. : 10/473592
DATED : January 1, 2008
INVENTOR(S) : Masahiro Mimura et al.

It is certified that error appears in the above-identified patent and that said Letters Patent is hereby corrected as shown below:

On the Title Page at item (56), References Cited, in OTHER PUBLICATIONS, line 6, "XP002443772" should be -- XP002243772 --.

In column 14, line 65 (claim 4, line 5) of the printed patent, "-2(t))" should be -- -e2(t)) --.

This certificate supersedes the Certificates of Correction issued June 10, 2008 and July 15, 2008.

Signed and Sealed this

Twenty-fifth Day of August, 2009

David J. Kappos
*Director of the United States Patent and Trademark Office*